United States Patent
Tiew

(10) Patent No.: US 9,609,259 B1
(45) Date of Patent: Mar. 28, 2017

(54) PIPELINED ANALOG-TO-DIGITAL CONVERTER INCORPORATING VARIABLE INPUT GAIN AND PIXEL READ OUT ANALOG FRONT END HAVING THE SAME

(71) Applicant: PIXART IMAGING (PENANG) SDN. BHD., Penang (MY)

(72) Inventor: Kei Tee Tiew, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 0 days.

(21) Appl. No.: 15/005,392

(22) Filed: Jan. 25, 2016

(51) Int. Cl.
  *H04N 5/335* (2011.01)
  *H04N 5/378* (2011.01)
  *H03M 1/36* (2006.01)
  *H04N 5/369* (2011.01)

(52) U.S. Cl.
  CPC ............ *H04N 5/378* (2013.01); *H03M 1/361* (2013.01); *H04N 5/3698* (2013.01)

(58) Field of Classification Search
  CPC .............................. H04N 5/378; H03M 1/167
  See application file for complete search history.

(56) References Cited

U.S. PATENT DOCUMENTS

| 5,635,937 A * | 6/1997 | Lim | H03M 1/168 |
| | | | 341/118 |
| 2013/0187801 A1* | 7/2013 | de Figueiredo | H03M 1/1009 |
| | | | 341/118 |
| 2015/0370952 A1* | 12/2015 | Wang | G06F 17/5072 |
| | | | 361/328 |

\* cited by examiner

*Primary Examiner* — Gary C Vieaux
(74) *Attorney, Agent, or Firm* — Li & Cai Intellectual Property (USA) Office

(57) ABSTRACT

A pipelined ADC incorporating variable input gain has a novel first stage generating a first digital output and a residue according to an analog input. The first stage comprises a novel MDAC. The MDAC comprises an operational amplifier, a feedback capacitor, a first sampling capacitor and a second sampling capacitor. First terminals of the feedback capacitor, the first sampling capacitor and the second sampling capacitor are connected to an inverted input terminal of the operational amplifier. A non-inverted input terminal of the operational amplifier is connected to a ground. In a sampling phase, second terminals of the feedback capacitor, the first sampling capacitor and the second sampling capacitor are connected to the analog input. In a charge transferring phase, second terminals of the feedback capacitor, the first sampling capacitor and the second sampling capacitor are respectively connected to the output terminal, a flash ADC output and the ground.

17 Claims, 7 Drawing Sheets

PIPELINED ANALOG-TO-DIGITAL CONVERTER INCORPORATING VARIABLE INPUT GAIN AND PIXEL READ OUT ANALOG FRONT END HAVING THE SAME

BACKGROUND OF THE INVENTION

1. Field of the Invention

The instant disclosure relates to an analog front end; in particular, to a pipelined analog-to-digital converter incorporating variable input gain and a pixel read out analog front end having the same.

2. Description of Related Art

An optical computer mouse uses a light source, typically a laser, and a light detector, such as a pixel array of photodiodes, to detect movement relative to a surface. A pixel read out front end is utilized to convert the analog signals of the pixel array to digital signals. Please refer to FIG. 1 showing a block diagram of a conventional pixel read out analog front end. The conventional pixel read out analog front end comprises a pixel array 1, transfer amplifier (TA) 2 and an analog-to-digital converter (ADC) 3. A source follower between the pixel array 1 and the transfer amplifier 2 is neglected in FIG. 1. The pixel array 1 is normally arranged in a square matrix with equal number of rows and columns (for example, 15 rows by 15 columns for a total of 15×15=225 pixels). After being exposed to external light sources reflected off an image surface 4, each of the pixels (a type of photo detector) converts the light signal to a voltage signal stored on a storage capacitor. The stored voltage signal in every pixel is read out serially through the transfer amplifier 2 and ADC (typically a pipelined ADC for high speed data conversion) 3 starting from the first row to the last row and in each row from the first column to the last column. A frame consists of the complete read out of all the pixels in the pixel array. The function of the programmable transfer amplifier 2 is to amplify the pixel voltage signal by a gain ranging typically between 1 and 3 before the analog-to-digital conversion for further digital signal processing. Since all the pixels in the pixel array share a common transfer amplifier (TA) and analog-to-digital converter (ADC), the speed of the transfer amplifier (TA) and ADC has to satisfy the following equation:

$$f_S = \frac{P \times P}{\left(\frac{1}{f_R} - t_{EXP} - t_{GB}\right)}$$

where
$f_S$=sampling rate of TA and ADC
P=number of rows=number of columns
$f_R$=frame rate
$t_{EXP}$=pixel exposure time
$t_{GB}$=guard band time between pixel exposure and read out.

For instance, in high performance optical gaming mouse applications, P=38, $f_R$=12,000 frames/s, $t_{EXP}$=30 us and $t_{GB}$=10 us, thus the transfer amplifier (TA) and analog-to-digital converter (ADC) have to work in excess of 30 MS/s which translates to high power consumption in these two blocks. Based on the same pixel array, the transfer amplifier (TA) and analog-to-digital converter (ADC) are configured for 50 MS/s operation, examples of the active average standby current ($I_{DDS}$) are around 650 uA, 1 mA and 1.3 mA respectively for the pixel array 1, transfer amplifier (TA) 2 and analog-to-digital converter (ADC) 3.

SUMMARY OF THE INVENTION

The object of the instant disclosure is to provide a pipelined analog-to-digital converter incorporating variable input gain and a pixel read out analog front end having the same. The pipelined analog-to-digital converter incorporating variable input gain combines the transfer amplifier and ADC functions of the conventional analog front end.

In order to achieve the aforementioned objects, according to an embodiment of the instant disclosure, a pipelined analog-to-digital converter incorporating variable input gain is provided. The pipelined analog-to-digital converter incorporating variable input gain comprises N stages coupled in cascade and an align and combine bits circuit. The N is an integer larger than 1. A first stage of the N stages generates a first digital output and a residue of the first stage according to an analog input. An N-th stage of the N stages acquires the residue from a previous stage ((N−1)th stage) to output an N-th digital output and a residue of the N-th stage. The align and combine bits circuit is coupled to each of the N stages for acquiring the first digital output to N-th digital output to generate M-bits digital output, where M>N. The first stage comprises a flash analog-to-digital converter (flash ADC) and a multiplying digital-to-analog converter (MDAC). The flash analog-to-digital converter (flash ADC) generates a flash ADC output according to the analog input. The multiplying digital-to-analog converter (MDAC) comprises an operational amplifier, a feedback capacitor, a first sampling capacitor and a second sampling capacitor. A first terminal of the feedback capacitor, a first terminal of the first sampling capacitor and a first terminal of the second sampling capacitor are connected to an inverted input terminal of the operational amplifier. A non-inverted input terminal of the operational amplifier is connected to a ground. The multiplying digital-to-analog converter (MDAC) operates in a sampling phase and a charge transferring phase. In the sampling phase, a second terminal of the feedback capacitor, a second terminal of the first sampling capacitor and a second terminal of the second sampling capacitor are connected to the analog input. At the same time, an output terminal of the operational amplifier is connected to the inverted input terminal of the operational amplifier. In the charge transferring phase, the second terminal of the feedback capacitor is connected to the output terminal of the operational amplifier. At the same time, the second terminal of the first sampling capacitor is connected to a corresponding reference voltage related to the flash ADC output, and the second terminal of the second sampling capacitor is connected to the ground. The residue of the first stage is an output of the multiplying digital-to-analog converter (MDAC) provided by the output terminal of the operational amplifier.

It can be emphasized that the above description (and subsequent ones) regarding the circuit containing operational amplifier is only for ease of illustration with single-ended circuit example. In actual implementation, fully differential circuit is employed as singled-ended circuit is rarely used (due to sensitivity to various noise sources).

In order to achieve the aforementioned objects, according to an embodiment of the instant disclosure, a pixel read out analog front end is provided. The pixel read out analog front end comprises a pixel array and a pipelined analog-to-digital converter incorporating variable input gain. The pixel array generates an analog input. The pipelined analog-to-digital converter incorporating variable input gain is coupled to the pixel array. The pipelined analog-to-digital converter incorporating variable input gain is the same as the aforementioned pipelined analog-to-digital converter.

In summary, a pipelined analog-to-digital converter incorporating variable input gain is provided by using a novel first stage. The provided pixel read out analog front end having the pipelined analog-to-digital converter incorporating variable input gain can replace the conventional pixel read out analog front end. The provided architecture of the provided pixel read out analog front end can save power consumption and save the silicon area compared to the conventional pixel read out analog front end.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 2:
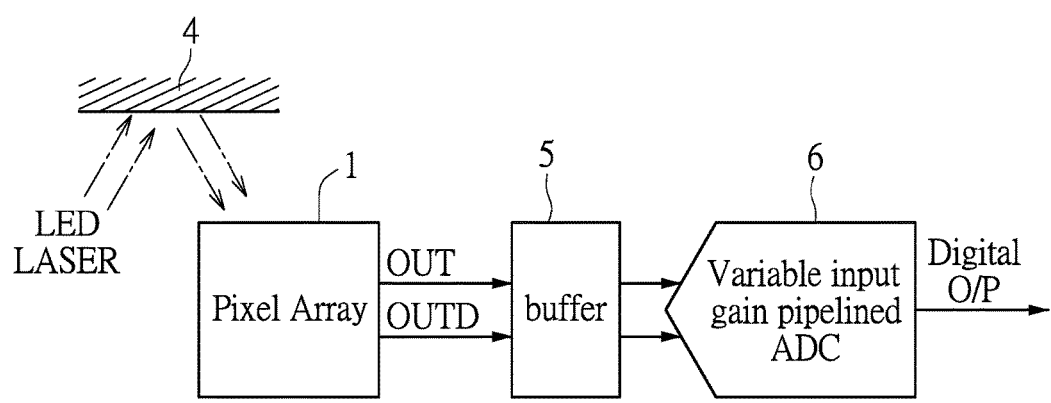
FIG. 2 shows a block diagram of a pixel read out analog front end according to an embodiment of the instant disclosure.

Please refer to FIG. 2 showing a block diagram of a pixel read out analog front end according to an embodiment of the instant disclosure. The pixel read out analog front end comprises a pixel array 1, a buffer 5 and a pipelined analog-to-digital converter 6 incorporating variable input gain. The buffer 5 coupled between the pixel array 1 and the pipelined analog-to-digital converter 6 can be used for reducing the operation current of the pipelined analog-to-digital converter 6. The buffer 5, which will be described hereinafter, is used to reduce the overall operation current (or power consumption) of the pixel read out analog front end shown in FIG. 2. The pixel array 1 generates an analog input Vin. The pipelined analog-to-digital converter 6 is coupled to the pixel array through the buffer 5. However, the buffer 5 is not necessary for the pixel read out analog front end.

Figure 3:
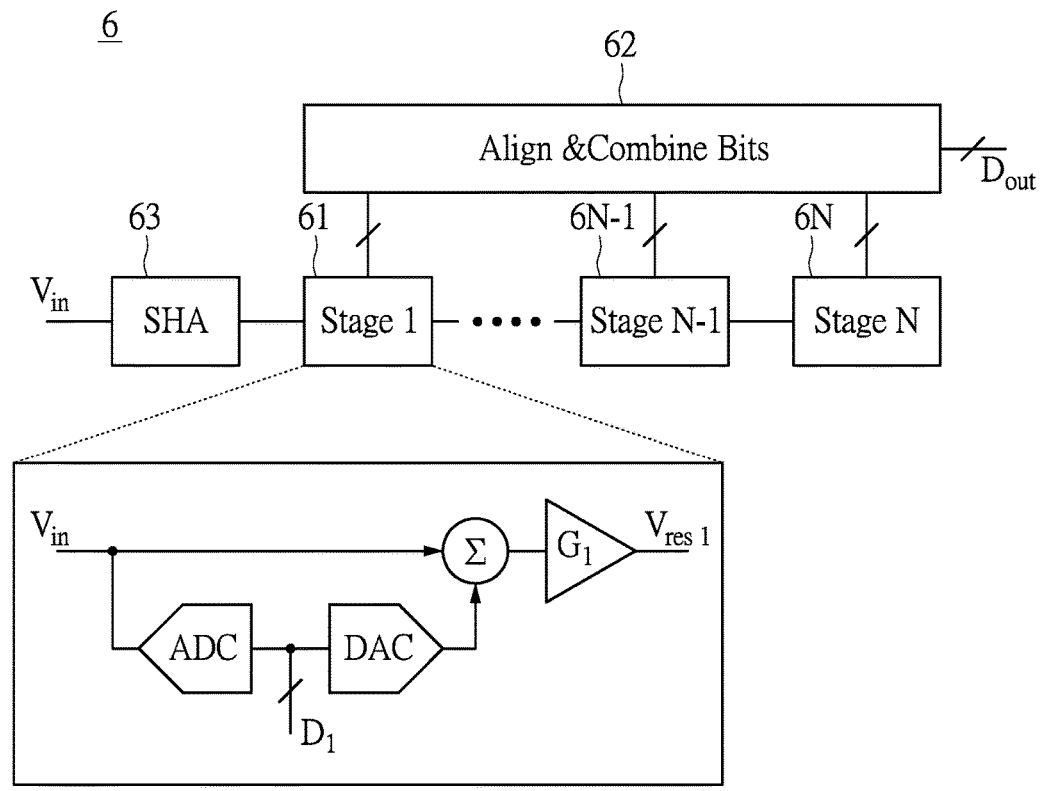
FIG. 3 shows a block diagram of a pipelined analog-to-digital converter incorporating variable input gain according to an embodiment of the instant disclosure.

Please refer to FIG. 3 showing a block diagram of a pipelined analog-to-digital converter incorporating variable input gain according to an embodiment of the instant disclosure. The pipelined analog-to-digital converter 6 comprises a sample and hold circuit 63, N stages coupled in cascade (61 . . . 6N−1, and 6N) and an align and combine bits circuit 62. The number N is an integer larger than 1.

The sample and hold circuit 63 is connected between a first stage 61 and the pixel array 1. The analog input $V_{in}$ generated from the pixel array 1 is converted from a light signal of an optical computer mouse. The analog input $V_{in}$ first passes through the sample and hold circuit 63 such as a sample and hold amplifier (SHA), if it is not a sampled-and-hold signal. The first stage 61 of the N stages generates a first digital output $D_1$ and a residue $V_{res1}$ of the first stage 61 according to the analog input $V_{in}$. In detail, the first stage consists of a coarse ADC and DAC (will be described in FIG. 4 in detail) to generate the most significant bit (MSB) portion ($D_1$) of a final ADC output ($D_{out}$) and an amplified residue voltage ($V_{res1}$) for conversion in a second stage and so on until the last stage (stage N). That is, an N-th stage of the N stages acquires the residue from a previous stage ((N−1)th stage) to output an N-th digital output and a residue of the N-th stage. For example, the (N−1)th stage 6N−1 acquires the residue from the previous stage (N−2)th stage to output N−1 digital out and a residue of the (N−1)th stage.

The align and combine bits circuit 62 is coupled to each of the N stages for acquiring the first digital output to N-th digital output to generate M-bits digital output $D_{out}$, where M>N. The first digital output to the N-th digital output can be n-bits. In fact, individual stage in a pipelined ADC may not have equal number of n-bit output. As individual stage in a pipelined ADC may generate more than 1-bit so that the final digital output provided by the align and combine bits circuit 62 could be M-bit resolution where M>N. The digital align and combine bits circuit 62 properly aligns the individual stage outputs ($D_1, D_2, \ldots D_N$) to generate the final multi-bit output $D_{out}$ corresponding to the sampled $V_{in}$ with certain latency depending on the number of stages.

The architecture of the pipelined analog-to-digital converter 6 is the same to the architecture of the conventional pipelined analog-to-digital converter 3 except that the first stage 61 of the pipelined analog-to-digital converter 6 is different from the conventional first stage of the conventional pipelined analog-to-digital converter. However, the architecture of the pipelined analog-to-digital converter of the instant disclosure is not so restricted. An artisan of ordinary skill in the art will appreciate the implementation manner of the architecture of the conventional pipelined analog-to-digital converter (abbreviate as pipelined ADC). Furthermore, compared to FIG. 1, by utilizing the provided pipelined ADC 6, the conventional transfer amplifier 2 is not required. The function of the provided pipelined ADC 6 has both the functions of the conventional transfer amplifier 2 and the conventional pipelined ADC 3. Details of the first stage 61 will be described in the following.

Figure 4:
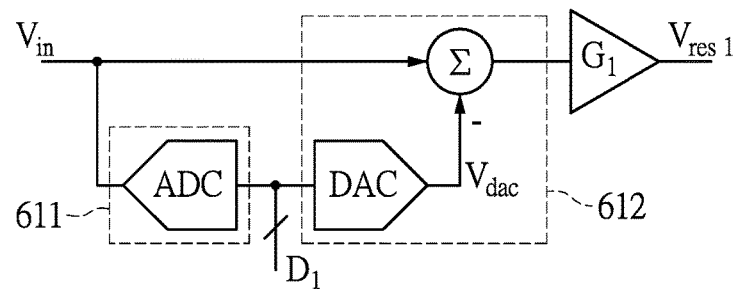
FIG. 4 shows a block diagram of a first stage of the N stages of the pipelined analog-to-digital converter shown in FIG. 3.
Figure 5:
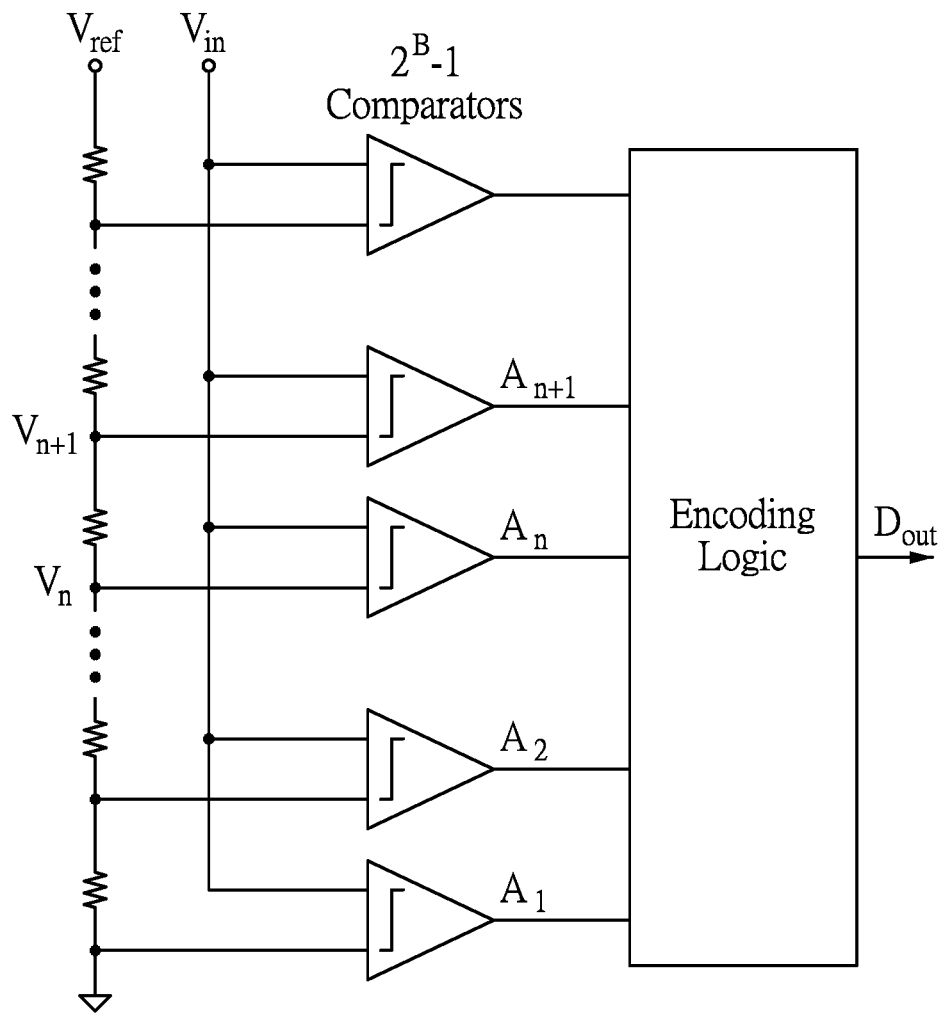
FIG. 5 shows a block diagram of conventional flash ADCs for all stages with an encoding logic block.
Figure 6A:
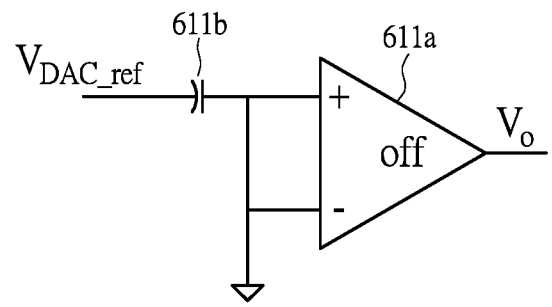
FIG. 6A shows a circuit diagram of a comparator in a flash ADC operating in a reset phase according to an embodiment of the instant disclosure.
Figure 6B:
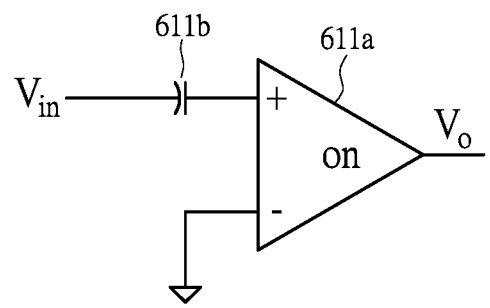
FIG. 6B shows a circuit diagram of a comparator in a flash ADC operating in a compare phase according to an embodiment of the instant disclosure.

Refer to FIG. 4 showing a block diagram of a first stage of the N stages of the pipelined ADC shown in FIG. 3. The first stage 61 comprises a flash analog-to-digital converter (flash ADC) 611 and a multiplying digital-to-analog converter (MDAC) 612. The flash analog-to-digital converter (flash ADC) 611 generates a flash ADC output $D_1$ according to the analog input $V_{in}$. Referring to FIG. 5 showing a block diagram of conventional flash ADCs for all stages with an encoding logic block. A B-bit flash ADC employs $2^B-1$ comparators to compare the analog input $V_{in}$ against a set of reference voltage to form a B-bit output as shown in FIG. 5. The operation of the flash ADCs for all stages with the encoding logic block can be appreciated by an artisan of ordinary skill in the art, thus there is no need to go into detail. Details of the circuit of the flash ADC are described in the following. Please refer to FIG. 6A in conjunction with FIG. 6B. Each comparator of FIG. 5 is implemented in the single ended form. The flash ADC comprises a regenerative amplifier 611a and a sampling capacitor 611b. The regenerative amplifier 611a has an inverted input terminal and a non-inverted input terminal and an output terminal. The inverted input terminal of the regenerative amplifier 611a is connected to the ground. The sampling capacitor 611b has a first terminal and a second terminal. The first terminal of the sampling capacitor 611b is connected to the non-inverted input terminal of the regenerative amplifier 611a. The flash ADC operates in a reset phase and a compare phase. In the reset phase, referring to FIG. 6A, the second terminal of the sampling capacitor 611b is connected to a reference voltage $V_{DAC\_ref}$, the first terminal of the sampling capacitor 611b is connected to the ground. The sampling capacitor 611b is pre-charged to the desired reference voltage $V_{DAC\_ref}$ while the regenerative amplifier 611a is off. In the compare phase, referring to FIG. 6B, the regenerative amplifier 611a is in operation. The second terminal of the sampling capacitor 611b is connected to the analog input $V_{in}$. And, the first terminal of the sampling capacitor 611b returns to connect with the non-inverted input terminal of the regenerative amplifier 611a. Then, the regenerative amplifier 611a can output the compare result. The output of a comparator in the flash analog-to-digital converter (flash ADC) is given by the following equation:

$$V_o = \begin{cases} 1 \text{ if } (V_i - V_{ADC\_ref}/k) \geq 0 \text{ or } (kV_i - V_{ADC\_ref}) \geq 0 \\ 0 \text{ if } (V_i - V_{ADC\_ref}/k) < 0 \text{ or } (kV_i - V_{ADC\_ref}) < 0 \end{cases},$$

where $V_i$ is the analog input (Vin), $V_{ADC\_ref}/k$ is the reference voltage, and k is a variable input gain of the analog input (Vin). The number k which is described hereinafter is corresponding to the gain of the conventional transfer amplifier (TA). The reference voltage can be generated from a resistor string and the scaled down version of $V_{ADC\_ref}$ could be easily obtained by dividing the resistor into finer segments with minimal penalty to the silicon area.

Figure 7A:
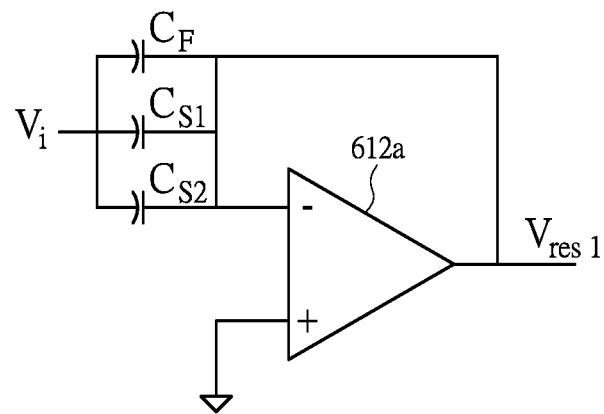
FIG. 7A shows a circuit diagram of a multiplying digital-to-analog converter (MDAC) operating in a sampling phase according to an embodiment of the instant disclosure.
Figure 7B:
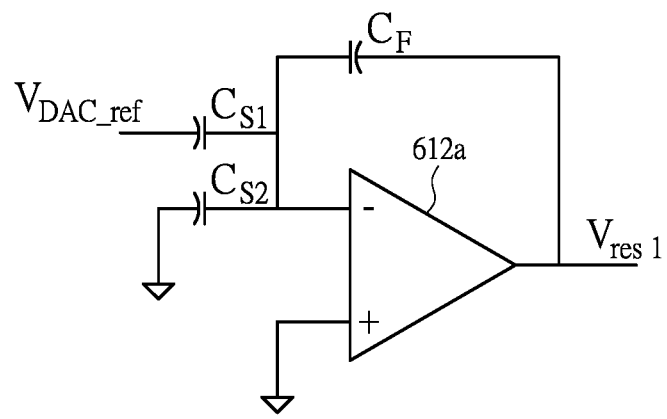
FIG. 7B shows a circuit diagram of a multiplying digital-to-analog converter (MDAC) operating in a charge transferring phase according to an embodiment of the instant disclosure.

Then, please refer to FIG. 7A and FIG. 7B. The multiplying digital-to-analog converter (MDAC) 612 can be implemented using a switched-capacitor circuit. The multiplying digital-to-analog converter (MDAC) 612 operates in a sampling phase referring to FIG. 7A and a charge transferring phase referring to FIG. 7B. The multiplying digital-to-analog converter (MDAC) 612 comprises an operational amplifier 612a, a feedback capacitor $C_F$, a first sampling capacitor $C_1$ and a second sampling capacitor $C_{S2}$. A first terminal of the feedback capacitor $C_F$, a first terminal of the first sampling capacitor $C_1$ and a first terminal of the second sampling capacitor $C_{S2}$ are connected to an inverted input terminal of the operational amplifier 612a. A non-inverted input terminal of the operational amplifier 612b is connected to the ground. In the sampling phase, referring to FIG. 7A, a second terminal of the feedback capacitor $C_F$, a second terminal of the first sampling capacitor $C_1$ and a second terminal of the second sampling capacitor $C_{S2}$ are connected to the analog input $V_{in}$. At the same time, an output terminal of the operational amplifier 612a is connected to the inverted input terminal of the operational amplifier 612a. In the charge transferring phase, referring to FIG. 7B, the second terminal of the feedback capacitor $C_F$ is connected to the output terminal of the operational amplifier 612a. At the same time, the second terminal of the first sampling capacitor $C_{S1}$ is connected to a corresponding reference voltage $V_{ADC\_ref}$ (this reference voltage will minimize the output residue voltage of the MDAC) related to the flash ADC output, and the second terminal of the second sampling capacitor $C_{S2}$ is connected to the ground. The residue $V_{res1}$ of the first stage 61 is the output of the multiplying digital-to-analog converter (MDAC) 612a provided by the output terminal of the operational amplifier 612a.

Before describing the output of the multiplying digital-to-analog converter (MDAC) 612, we discuss the conventional transfer amplifier (TA) and the conventional multiplying digital-to-analog converter (MDAC). The architecture of the multiplying digital-to-analog converter (MDAC) 612 combines the conventional transfer amplifier (TA) and the conventional multiplying digital-to-analog converter (MDAC). Please refer to FIG. 8A and FIG. 8B respectively showing a circuit diagram of a conventional transfer amplifier (TA) operating in a sampling phase and a charge transferring phase. The transfer amplifier operates in two phases, namely the sampling phase and charge transferring phase. In the sampling phase, the input is sampled by the sampling capacitor $C_S$ while the feedback capacitor $C_F$ is fully discharged. In the subsequent charge transferring phase, the charge stored in the sampling capacitor $C_S$ is fully transferred to the feedback capacitor $C_F$ and the output voltage $V_o$ is given by $V_o = (C_S/C_F)V_i$ whereby the ratio of $C_S$ and $C_F$ determines the transfer amplifier gain ranging typically from 2 to 4 (i.e. $C_S > C_F$).

Figure 9A:
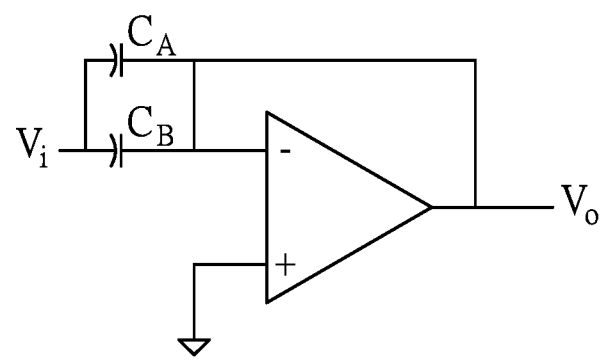
FIG. 9A shows a circuit diagram of a conventional multiplying digital-to-analog converter (MDAC) operating in a sampling phase.
Figure 9B:
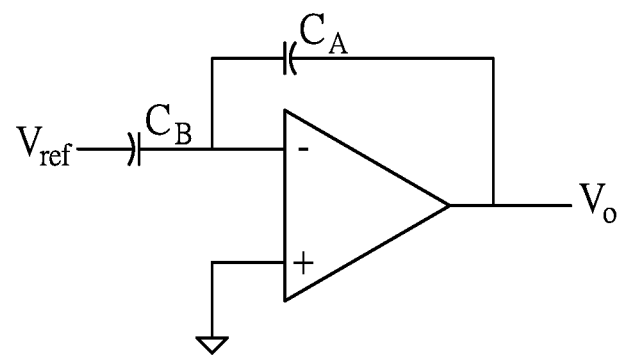
FIG. 9B shows a circuit diagram of a conventional multiplying digital-to-analog converter (MDAC) operating in a charge transferring phase.

Then, please refer to FIG. 9A and FIG. 9B. FIG. 9A shows a circuit diagram of a conventional multiplying digital-to-analog converter (MDAC) operating in a sampling phase. FIG. 9B shows a circuit diagram of a conventional multiplying digital-to-analog converter (MDAC) operating in a charge transferring phase. Similar to the transfer amplifier (TA), the MDAC operates in two phases. During the sampling phase, the input $V_1$ is sampled by capacitors $C_A$ and $C_B$ in parallel. During the charge transferring phase, the capacitor $C_A$ is flipped around the operational amplifier to become the feedback capacitor while the capacitor $C_B$ is connected to a variable reference voltage ($V_{ref}$) whose value depends on the flash ADC output.

The output of the MDAC is given by the following equation:

$$V_o = \frac{C_A + C_B}{C_A} V_i - \frac{C_B}{C_A} V_{ref}$$

It can be seen that the residue output $V_o$ is equal to the difference of $V_i$ multiplied by $(1+C_B/C_A)$ and $V_{ref}$ scaled by a factor of $C_B/C_A$. For $C_B=3C_A$, the residue is $V_o=4V_i-3V_{ref}$.

Figure 8A:
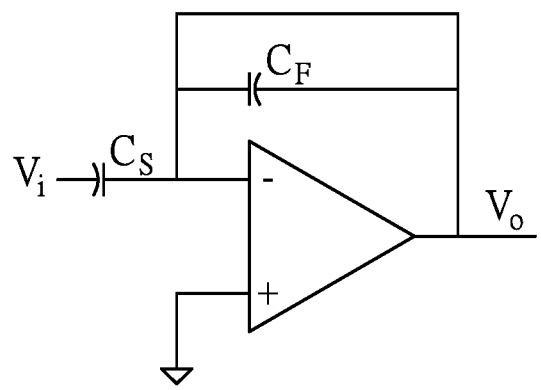
FIG. 8A shows a circuit diagram of a conventional transfer amplifier (TA) operating in a sampling phase.
Figure 8B:
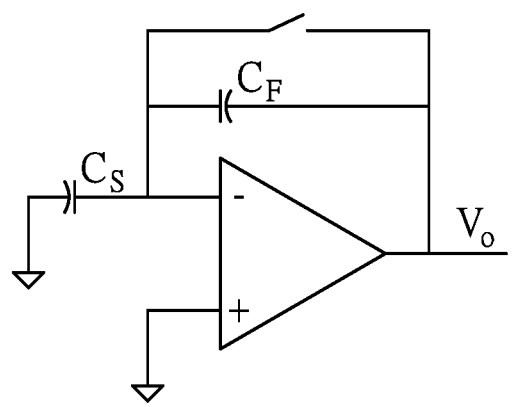
FIG. 8B shows a circuit diagram of a conventional transfer amplifier (TA) operating in a charge transferring phase.

By comparing the MDAC 612 with the conventional transfer amplifier (TA), referring to FIG. 7A, FIG. 7B in conjunction with FIG. 8A, FIG. 8B, the feedback capacitor $C_F$ of the MDAC 612 can be considered as the feedback capacitor $C_F$ of the transfer amplifier (TA) shown in FIG. 8A and FIG. 8B due to similar operation. Also, the second sampling capacitor $C_{S2}$ of the MDAC 612 can be considered as the sampling capacitor $C_S$ due to similar operation of the second sampling capacitor $C_{S2}$ and the sampling capacitor $C_S$.

By comparing the MDAC 612 with the conventional MDAC, referring to FIG. 7A, FIG. 7B in conjunction with FIG. 9A, FIG. 9B, the feedback capacitor $C_F$ of the MDAC can be considered as the capacitor $C_A$ of the conventional multiplying digital-to-analog converter (MDAC) shown in FIG. 9A and FIG. 9B due to similar operation of the feedback capacitor $C_F$ and the capacitor $C_A$. Also, the first sampling capacitor $C_{S1}$ of the MDAC 612 can be considered as the capacitor $C_B$. As a result, compared to utilizing the conventional transfer amplifier (TA) and the conventional MDAC, one operational amplifier (used in the transfer amplifier (TA)) can be saved by removing the conventional transfer amplifier (TA) and utilizing the provided MDAC 612 of this embodiment.

The output of the multiplying digital-to-analog converter (MDAC) 612 is given by the following equation:

$$V_{res1} = \frac{C_F + C_{S1} + C_{S2}}{C_F} V_i - \frac{C_{S1}}{C_F} V_{DAC\_ref},$$

where $C_F$ is the capacitance of the feedback capacitor, $C_{S1}$ is the capacitance of the first sampling capacitor, $C_{S2}$ is the capacitance of the second sampling capacitor, $V_i$ is the analog input (Vin), and $V_{DAC\_ref}$ is a corresponding reference voltage related to the flash ADC output. By matching the $V_i$ multiplying factor of $(C_F+C_{S1}+C_{S2})/C_F=k*(C_A+C_B)/C_A$ of the conventional first stage MDAC of the pipelined ADC where k=TA gain in the conventional scheme (FIG. 1), we can effectively achieve the same effect of converting the amplified pixel signal through a TA provided. We also can match the second term factor of $C_{S1}/C_F=C_B/C_A$ in the conventional scheme. Also, as aforementioned the flash ADC 611 of the first stage 61 has taken into account the effective TA gain of k in the pipelined ADC of this embodiment. Therefore, the provided pixel read out analog front end shown in FIG. 2 of the instant disclosure can replace the conventional pixel read out analog front end shown in FIG. 1.

Figure 1:
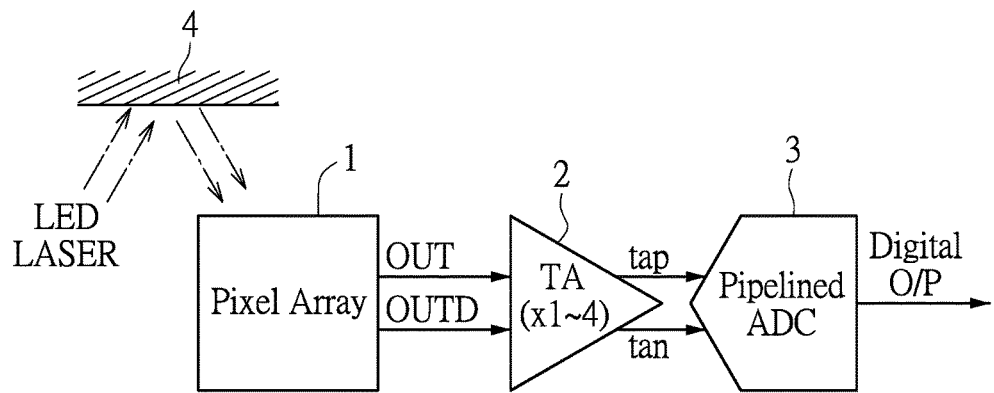
FIG. 1 shows a block diagram of a conventional pixel read out analog front end.

Furthermore, compared with the conventional pixel read out analog front end shown in FIG. 1, the buffer 5 shown in FIG. 2 can reduce the consumed current due to higher capacitive load from MDAC 612 of the first stage 61 (referring to FIG. 7A) especially for high k, in order to reduce the overall operation current of the pixel read out analog front end shown in FIG. 2. The power consumption of the added buffer 5 coupled between the pixel array 1 and the pipelined ADC 6 can be less than the power consumption of the transfer amplifier (TA) (and power consumption of a source follower) used in the conventional pixel read out analog front end. That is, when replacing the conventional pixel read out analog front end shown in FIG. 1 by the provided pixel read out analog front end shown in FIG. 2, the provided pixel read out analog front end can have lower power consumption compared to the conventional pixel read out analog front end because of removing the transfer amplifier (TA) but adding the buffer 5. In an application of gaming computer mouse design, when considering an 8-bit pipelined ADC at 50 MS/s operation, power saving of 25% to 34% can be expected when k ranges from 2 to 4, and the feedback capacitor $C_F$ is the same as (or half of) the feedback capacitor $C_F$ of the conventional transfer amplifier (TA) (referring to FIG. 8A and FIG. 8B). Furthermore, the silicon area of the provided pixel read out analog front end can be saved because of not using the conventional transfer amplifier. More than 10% saving in the silicon area can be expected compared to the conventional transfer amplifier (TA) and pipelined ADC scheme (FIG. 1). It is envisaged that the saving in terms of silicon area and power could be even more substantial when the sampling speed of TA and ADC is increased further in the future high-end gaming mouse design.

According to above description, a pipelined ADC incorporating variable input gain is provided by using a novel first stage. The provided pixel read out analog front end having the pipelined ADC incorporating variable input gain can replace the conventional pixel read out analog front end. The provided architecture of the provided pixel read out analog front end can save power consumption and save the silicon area compared to the conventional pixel read out analog front end.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A pipelined analog-to-digital converter incorporating variable input gain, comprising:
   N stages coupled in cascade, N being an integer larger than 1, a first stage of the N stages generating a first digital output and a residue of the first stage according to an analog input, a N-th stage of the N stages acquiring the residue from a previous stage ((N−1)th stage) to output an N-th digital output and a residue of the N-th stage; and
   an align and combine bits circuit, coupled to each of the N stages, acquiring the first digital output to N-th digital output to generate M-bits digital output, where M>N;
   wherein the first stage comprises:
   a flash analog-to-digital converter (flash ADC), generating a flash ADC output according to the analog input; and
   a multiplying digital-to-analog converter (MDAC), comprising an operational amplifier, a feedback capacitor, a first sampling capacitor and a second sampling capacitor, wherein a first terminal of the feedback capacitor, a first terminal of the first sampling capacitor and a first terminal of the second sampling capacitor are connected to an inverted input terminal of the operational amplifier, a non-inverted input terminal of the operational amplifier is connected to a ground;
   wherein the multiplying digital-to-analog converter (MDAC) operates in a sampling phase and a charge transferring phase;
   wherein in the sampling phase a second terminal of the feedback capacitor, a second terminal of the first sampling capacitor and a second terminal of the second sampling capacitor are connected to the analog input, an output terminal of the operational amplifier is connected to the inverted input terminal of the operational amplifier;

wherein in the charge transferring phase the second terminal of the feedback capacitor is connected to the output terminal of the operational amplifier, the second terminal of the first sampling capacitor is connected to a corresponding reference voltage related to the flash ADC output, the second terminal of the second sampling capacitor is connected to the ground;

wherein the residue of the first stage is an output of the multiplying digital-to-analog converter (MDAC) provided by the output terminal of the operational amplifier.

2. The pipelined analog-to-digital converter incorporating variable input gain according to claim 1, wherein the output of the multiplying digital-to-analog converter (MDAC) is given by the following equation:

$$V_{res1} = \frac{C_F + C_{S1} + C_{S2}}{C_F} V_i - \frac{C_{S1}}{C_F} V_{DAC\_ref},$$

where $C_F$ is the capacitance of the feedback capacitor, $C_{S1}$ is the capacitance of the first sampling capacitor, $C_{S2}$ is the capacitance of the second sampling capacitor, $V_i$ is the analog input, and $V_{DAC\_ref}$ is the corresponding reference voltage related to the flash ADC output.

3. The pipelined analog-to-digital converter according to claim 1, wherein the multiplying digital-to-analog converter (MDAC) is a switched-capacitor circuit.

4. The pipelined analog-to-digital converter incorporating variable input gain according to claim 3, wherein the output of the flash analog-to-digital converter (flash ADC) is given by the following equation:

$$V_o = \begin{cases} 1 \text{ if } (V_i - V_{ADC\_ref}/k) \geq 0 \text{ or } (kV_i - V_{ADC\_ref}) \geq 0 \\ 0 \text{ if } (V_i - V_{ADC\_ref}/k) < 0 \text{ or } (kV_i - V_{ADC\_ref}) < 0 \end{cases},$$

where $V_i$ is the analog input, $V_{ADC\_ref}/k$ is the reference voltage, k is a variable input gain of the analog input.

5. The pipelined analog-to-digital converter incorporating variable input gain according to claim 4, wherein the reference voltage is generated from a resistor string.

6. The pipelined analog-to-digital converter incorporating variable input gain according to claim 1, wherein the flash analog-to-digital converter (flash ADC) operates in a reset phase and a compare phase, the flash analog-to-digital converter (flash ADC) comprises:
a regenerative amplifier, having an inverted input terminal and a non-inverted input terminal and an output terminal, the inverted input terminal connected to the ground; and
a third sampling capacitor, a first terminal of the third sampling capacitor connected to the non-inverted input terminal of the regenerative amplifier;
wherein in the reset phase a second terminal of the third sampling capacitor is connected to a reference voltage, the first terminal of the third sampling capacitor is connected to the ground;
wherein in the compare phase the second terminal of the third sampling capacitor is connected to the analog input.

7. The pipelined analog-to-digital converter incorporating variable input gain according to claim 1, wherein the analog input is converted by the pixel array from a light signal of an optical computer mouse.

8. The pipelined analog-to-digital converter according to claim 1, wherein the pipelined analog-to-digital converter further comprises a sample and hold circuit connected between the first stage and a pixel array.

9. A pixel read out analog front end, comprising:
a pixel array, generating an analog input; and
a pipelined analog-to-digital converter incorporating variable input gain, coupled to the pixel array, comprising:
N stages coupled in cascade, N being an integer larger than 1, a first stage of the N stages generating a first digital output and a residue of the first stage according to the analog input, an N-th stage of the N stages acquiring the residue from a previous stage ((N−1)th stage) to output an N-th digital output and a residue of the N-th stage; and
an align and combine bits circuit, coupled to each of the N stages, acquiring the first digital output to N-th digital output to generate M-bits digital output, where M>N;
wherein the first stage comprises:
a flash analog-to-digital converter (flash ADC), generating a flash ADC output according to the analog input; and
a multiplying digital-to-analog converter (MDAC), comprising an operational amplifier, a feedback capacitor, a first sampling capacitor and a second sampling capacitor, wherein a first terminal of the feedback capacitor, a first terminal of the first sampling capacitor and a first terminal of the second sampling capacitor are connected to an inverted input terminal of the operational amplifier, a non-inverted input terminal of the operational amplifier is connected to a ground;
wherein the multiplying digital-to-analog converter (MDAC) operates in a sampling phase and a charge transferring phase;
wherein in the sampling phase a second terminal of the feedback capacitor, a second terminal of the first sampling capacitor and a second terminal of the second sampling capacitor are connected to the analog input, an output terminal of the operational amplifier is connected to the inverted input terminal of the operational amplifier;
wherein in the charge transferring phase the second terminal of the feedback capacitor is connected to the output terminal of the operational amplifier, the second terminal of the first sampling capacitor is connected to a corresponding reference voltage related to the flash ADC output, the second terminal of the second sampling capacitor is connected to the ground;
wherein the residue of the first stage is an output of the multiplying digital-to-analog converter (MDAC) provided by the output terminal of the operational amplifier.

10. The pixel read out analog front end according to claim 9, further comprising:
a buffer, coupled between the pixel array and the pipelined analog-to-digital converter.

11. The pixel read out analog front end according to claim 9, wherein the output of the multiplying digital-to-analog converter (MDAC) is given by the following equation:

$$V_{res1} = \frac{C_F + C_{S1} + C_{S2}}{C_F} V_i - \frac{C_{S1}}{C_F} V_{DAC\_ref},$$

where $C_F$ is the capacitance of the feedback capacitor, $C_{S1}$ is the capacitance of the first sampling capacitor, $C_{S2}$ is the capacitance of the second sampling capacitor, $V_i$ is the analog input, and $V_{DAC\_ref}$ is the corresponding reference voltage related to the flash ADC output.

12. The pixel read out analog front end according to claim 9, wherein the multiplying digital-to-analog converter (MDAC) is a switched-capacitor circuit.

13. The pixel read out analog front end according to claim 9, wherein the flash analog-to-digital converter (flash ADC) operates in a reset phase and a compare phase, the flash analog-to-digital converter (flash ADC) comprises:
   a regenerative amplifier, having an inverted input terminal and a non-inverted input terminal and an output terminal, the inverted input terminal connected to the ground; and
   a third sampling capacitor, a first terminal of the third sampling capacitor connected to the non-inverted input terminal of the regenerative amplifier;
   wherein in the reset phase a second terminal of the third sampling capacitor is connected to a reference voltage, the first terminal of the third sampling capacitor is connected to the ground;
   wherein in the compare phase the second terminal of the third sampling capacitor is connected to the analog input.

14. The pixel read out analog front end according to claim 13, wherein the output of a comparator in the flash analog-to-digital converter (flash ADC) is given by the following equation:

$$V_o = \begin{cases} 1 & \text{if } (V_i - V_{ADC\_ref}/k) \geq 0 \text{ or } (kV_i - V_{ADC\_ref}) \geq 0 \\ 0 & \text{if } (V_i - V_{ADC\_ref}/k) < 0 \text{ or } (kV_i - V_{ADC\_ref}) < 0 \end{cases},$$

where $V$ is the analog input, $V_{ADC\_ref}/k$ is the reference voltage, k is a variable input gain of the analog input.

15. The pixel read out analog front end according to claim 14, wherein the reference voltage is generated from a resistor string.

16. The pixel read out analog front end according to claim 9, wherein the analog input is converted by the pixel array from a light signal of an optical computer mouse.

17. The pixel read out analog front end according to claim 9, wherein the pipelined analog-to-digital converter further comprises a sample and hold circuit connected between the first stage and the pixel array.

\* \* \* \* \*